United States Patent
Mannak et al.

(10) Patent No.: US 6,713,867 B2
(45) Date of Patent: Mar. 30, 2004

(54) PACKAGE FOR MICROWAVE COMPONENTS

(75) Inventors: Jan Hendrik Mannak, Apeldoorn (NL); Ivo Antoni Gerardus Maatman, Borne (NL)

(73) Assignee: Thales Nederland B.V., Hengelo (NL)

( * ) Notice: Subject to any disclaimer, the term of this patent is extended or adjusted under 35 U.S.C. 154(b) by 0 days.

(21) Appl. No.: 10/182,702

(22) PCT Filed: Feb. 1, 2001

(86) PCT No.: PCT/EP01/01092
§ 371 (c)(1),
(2), (4) Date: Nov. 1, 2002

(87) PCT Pub. No.: WO01/58227
PCT Pub. Date: Aug. 9, 2001

(65) Prior Publication Data
US 2003/0107128 A1 Jun. 12, 2003

(30) Foreign Application Priority Data

Feb. 7, 2000 (NL) ............................................. 1014304
Sep. 25, 2000 (NL) ............................................. 1016260

(51) Int. Cl.[7] ............................................................. H01L 23/34
(52) U.S. Cl. ..................... 257/728; 257/680; 257/704; 257/6.78
(58) Field of Search ................................. 257/704, 680, 257/728, 675

(56) References Cited

U.S. PATENT DOCUMENTS

| | | | | |
|---|---|---|---|---|
| 4,293,519 A | | 10/1981 | Knappenberger et al. | |
| 5,276,414 A | * | 1/1994 | Fujimoto et al. | 333/246 |
| 5,359,488 A | * | 10/1994 | Leahy et al. | 361/707 |
| 5,550,403 A | * | 8/1996 | Carichner | 257/702 |
| 5,773,121 A | * | 6/1998 | Meteer et al. | 428/117 |
| 5,838,551 A | * | 11/1998 | Chan | 361/818 |
| 6,057,600 A | * | 5/2000 | Kitazawa et al. | 257/728 |
| 6,154,372 A | * | 11/2000 | Kalivas et al. | 361/784 |
| 6,229,404 B1 | * | 5/2001 | Hatanaka | 331/68 |
| 6,281,574 B1 | * | 8/2001 | Drake et al. | 257/706 |
| 6,333,552 B1 | * | 12/2001 | Kakimoto et al. | 257/728 |
| 6,344,609 B1 | * | 2/2002 | Nakano | 361/753 |
| 6,483,186 B1 | * | 11/2002 | Hsieh et al. | 257/707 |

FOREIGN PATENT DOCUMENTS

| | | |
|---|---|---|
| DE | 43 26 825 | 6/1994 |
| EP | 0 308 676 | 3/1989 |
| EP | 0 807 971 | 11/1997 |
| FR | 2 688 940 | 9/1993 |
| JP | 05 206325 | 8/1993 |

* cited by examiner

*Primary Examiner*—Jasmine Clark
(74) *Attorney, Agent, or Firm*—Oblon, Spivak, McClelland, Maier & Neustadt, P.C.

(57) ABSTRACT

A package for a printed circuit and a method for packaging a circuit including exposed components placed on a printed circuit, the circuit including microwave components. At least part of the circuit that contains microwave components is covered with a layer of syntactic foam including a matrix of epoxy resin or cyanate ester, filled with microballoons of glass or a ceramic material. Subsequently, the entire circuit is covered with a moisture-proof top layer.

8 Claims, 2 Drawing Sheets

PACKAGE FOR MICROWAVE COMPONENTS

BACKGROUND OF THE INVENTION

Field of the Invention

The invention relates to a method for packaging a circuit containing microwave components or microwave components and digital components, the components being placed on a printed circuit.

DISCUSSION OF THE BACKGROUND

For packaging a circuit of the above type use is made in the art of a hermetic metal housing, with at least the microwave components being placed unencapsulated in an inert gas. It is actually an ideal package, but it is also an expensive one, because each connection must be realized via a glass bead in the housing wall. Especially if there are many connections, for example carrying digital control signals, the cost of the packaging becomes prohibitive and thus impractical.

A further drawback of the known packaging method is that the package is considerably heavier and bulkier than the circuit proper. This drawback is felt in particular with applications for aircraft.

Of exposed circuits with the exception of microwave components it is known that they can be protected against moisture and corrosion by providing them with a top layer of lacquer, for example a polymer lacquer. For the protection of microwave components this is not possible, because the top layer introduces dielectric losses, causing the circuit to function suboptimally or not at all. Besides, a circuit packaged in this way is very susceptible to moisture, as any moisture in the vicinity of the circuit occasions losses of such magnitude that the circuit no longer operates.

SUMMARY OF THE INVENTION

The method according to the invention meets these objections, and is characterized in that at least the microwave components are covered with a layer of syntactic foam comprising a matrix of epoxy resin or cyanate ester, filled with microballoons of glass or a ceramic material, the circuit subsequently being covered with a moisture-proof top layer. The syntactic foam layer reduces the dielectric losses as only very little dielectric is present in the vicinity of the microwave components, at the same time enlarging the distance between the microwave components and any moisture present in the top layer.

An advantageous realization of the inventive method is characterized in that in the syntactic foam 50–80% of the volume is occupied by microballoons. Syntactic foam of this composition is sufficiently robust, causes little dielectric losses and is exceptionally light. Compared with a circuit packaged hermetically in a known manner, the volume and weight are at least halved.

A further advantageous realization of the inventive method is characterized in that during curing of the matrix the circuit is held in a position such that an upward pressure due to the gravitational force or a centrifugal force will guide the microballoons to the microwave components. Thus, the relatively large concentration of microballoons in the matrix near the microwave components will reduce the dielectric losses further still, while the mechanical properties of the syntactic foam remain virtually the same.

A preferred realization of the inventive method, having as an additional advantage that on the one hand electromagnetic radiation cannot penetrate to the microwave components and on the other that the microwave components are prevented from emitting electromagnetic radiation, is characterized in that after application of the top layer, at least at the spots where the microwave components are situated the top layer is provided with a metallization.

A further advantageous realization of the inventive method is characterized in that the metallization is applied in the form of a conducting paint or by depositing metal particles through sputtering. An alternative advantageous realization is characterized in that the metallization is realized through fitting a metal plate over the syntactic foam layer.

The invention also relates to a package for a printed circuit comprising microwave components or microwave components and digital components. It is characterized in that the package for the microwave components includes a layer of syntactic foam, and that the printed circuit, including the syntactic foam layer is provided with a moisture-proof top layer.

BRIEF DESCRIPTION OF THE DRAWINGS

The invention will now be explained with reference to the following Figures, where.

DESCRIPTION OF THE PREFERRED EMBODIMENTS

Figure 1:
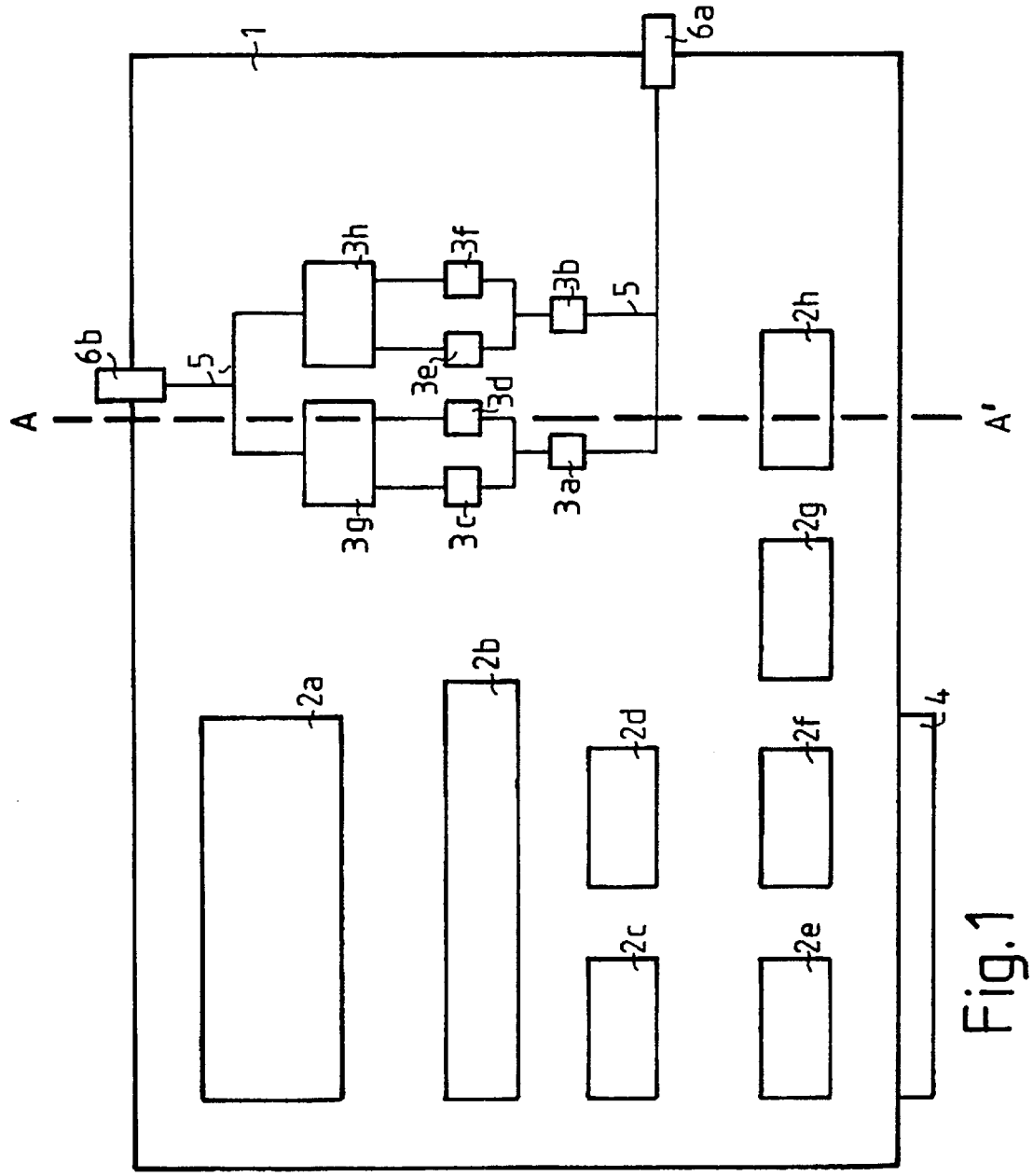
FIG. 1 schematically represents a circuit according to the invention in top view.

FIG. 1 schematically represents a printed circuit 1 according to the invention, on which digital components 2a, 2b, 2c, . . . and microwave components 3a, 3b, 3c, . . . are placed. At the spots where the digital components 2a, 2b, 2c, . . . are situated, printed circuit 1 is implemented as a multilayer in a manner known in the art, and is also provided with a connector 4 for the leading in and out of digital information. At the spots where the microwave components 3a, 3b, 3c, . . . are situated, printed circuit 1 is implemented as microstrip line 5 in a manner known in the art, and is also provided with connectors 6a, 6b for the leading in and out of microwave signals.

Figure 2:
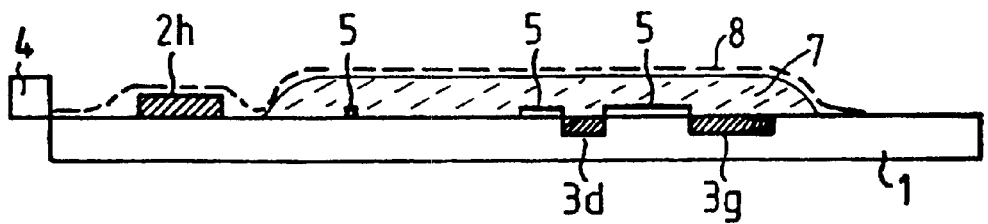
FIG. 2 schematically represents a circuit according to the invention in cross-section.

FIG. 2 schematically represents a printed circuit 1 according to the invention in cross-section along the line AA' in FIG. 1, where a digital component 2h, microwave components 3d, 3g, microstrip line 5 and a connector 4 are visible. According to the invention, microwave components 3d, 3g and microstrip line 5 are completely covered with a layer of syntactic foam 7. Syntactic foam as such is known in the art, and is for example used to lend buoyancy to floating bodies. On the syntactic foam layer and on the rest of printed circuit 1, a top layer 8 of, for example, polymer lacquer is applied.

Figure 3:
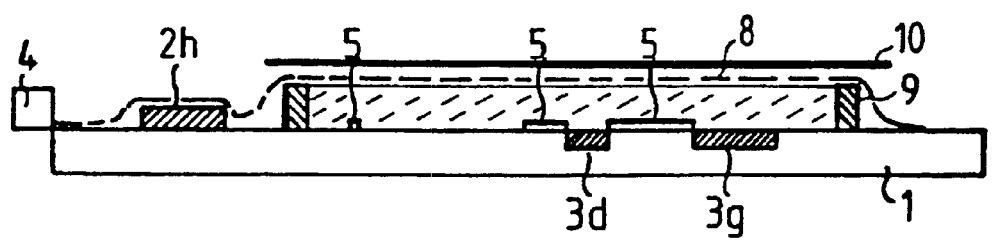
FIG. 3 schematically represents a circuit according to the invention in cross-section, provided with a wall.

FIG. 3 also schematically represents a printed circuit 1 according to the invention in cross-section along the line AA' in FIG. 1, where around the microwave part a wall 9 of, for example, a synthetic material is applied, which may facilitate the filling with syntactic foam. In this realization a metallization 10 is moreover applied to top layer 8 with a conducting paint or through sputtering. Metallization 10 may also take the form of a metal plate over the layer of syntactic foam, and subsequently, for example using a soldered connection, be attached to an earth pad in printed circuit 1.

Figure 4:
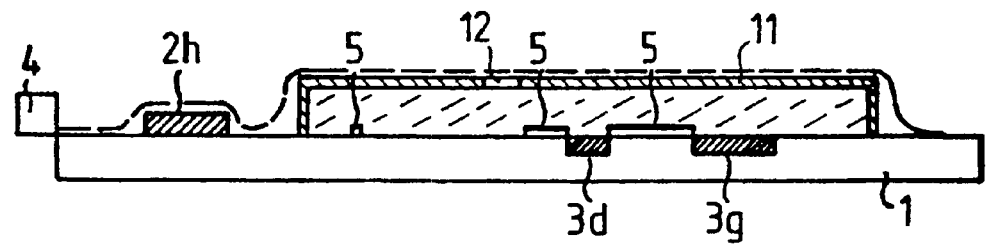
FIG. 4 schematically represents a circuit according to the invention in cross-section, provided with a cap.

FIG. 4 schematically represents a printed circuit 1 according to the invention in cross-section along the line AA' in FIG. 1, where around the microwave part a cap 11 of a synthetic material or metal is fitted, provided with an aperture 12, through which cap 11 can be filled with syntactic foam. With a metal cap, a suitable shield against microwave radiation is automatically effected, with a synthetic cap the top layer may additionally be provided with a metallization, if preferred.

Of course, the packaging method described above may also be profitably used if the circuit contains only microwave components, and particularly for packaging microwave elements on a substrate of, for example, ceramic material or duroid.

What is claimed is:

1. Method for packaging a circuit including microwave components or microwave components and digital components, the components being placed on a printed circuit, comprising:

covering at least the microwave components with a layer of syntactic foam comprising a matrix of epoxy resin or cyanate ester, filled with microballoons of glass or a ceramic material; and subsequently covering the circuit with a moisture-proof top layer.

2. Method according to claim 1, wherein in the syntactic foam 50–80% of volume is occupied by the microballoons.

3. Method according to claim 1, further comprising curing the matrix, and during the curing the printed circuit is held in a position such that an upward pressure due to a gravitational force or a centrifugal force guides the microballoons to the microwave components.

4. Method according to claim 2, further comprising curing the matrix, and during the curing the printed circuit is held in a position such that an upward pressure due to a gravitational force or a centrifugal force guides the microballoons to the microwave components.

5. Method according to claim 1, further comprising, after the covering with the top layer, providing the top layer, at least at spots where the microwave components are situated, with a metallization.

6. Method according to claim 5, wherein the metallization is applied in a form of a conducting paint or by depositing metal particles through sputtering.

7. Method according to claim 5, wherein the metallization is realized through fitting a metal plate over the syntactic foam layer.

8. Package for a printed circuit comprising microwave components or microwave components and digital components, wherein the package for the microwave components includes a layer of syntactic foam, and wherein the printed circuit, including the syntactic foam layer, is provided with a moisture-proof top layer.

* * * * *